United States Patent [19]
Matsuura et al.

[11] Patent Number: 5,428,005
[45] Date of Patent: Jun. 27, 1995

[54] SUPERCONDUCTING THIN FILM OF COMPOUND OXIDE AND A PROCESS OF PREPARING THE SAME

[75] Inventors: Takashi Matsuura; Keizo Harada; Hidenori Nakanishi; Hideo Itozaki, all of Hyogo, Japan

[73] Assignee: Sumitomo Electric Industries, Ltd., Osaka, Japan

[21] Appl. No.: 259,348

[22] Filed: Jun. 14, 1994

Related U.S. Application Data

[63] Continuation of Ser. No. 987,136, Dec. 8, 1992, abandoned, which is a continuation of Ser. No. 722,478, Jun. 28, 1991, abandoned.

[30] Foreign Application Priority Data

Jun. 28, 1990 [JP] Japan ................... 2-170992

[51] Int. Cl.$^6$ .................................................. B32B 9/00
[52] U.S. Cl. .................................. 505/234; 505/701; 505/238; 428/930; 428/688; 428/689; 428/700
[58] Field of Search ............. 428/688, 689, 209, 210, 428/930, 701, 702; 505/234, 239, 701, 702, 703, 704

[56] References Cited

U.S. PATENT DOCUMENTS

| | | | |
|---|---|---|---|
| 4,960,751 | 10/1990 | Yamazaki | 505/1 |
| 5,047,385 | 9/1991 | Beasley | 505/1 |
| 5,081,074 | 1/1992 | Murayama | 505/1 |
| 5,126,315 | 6/1992 | Nishino et al. | 505/1 |
| 5,151,408 | 9/1992 | Tanaka | 505/1 |

OTHER PUBLICATIONS

Nakao et al., Japanese Journal of Applied Physics, vol. 27, No. 3, Mar. 1988, pp. L378–L380.
Eom et al., "Epitaxial and Smooth Films of a-Axis YBa$_2$Cu$_3$O$_7$", Science vol. 249 pp. 1549–1552.
Sahu et al., "Chemistry of Tc Superconductors II", ACS 1988, Chapter 1.
Superconductors' Material Problems, Science vol. 240, Apr. 1, 1988 pp. 25–26.
Geballe, Science vol. 259, Mar. 12, 1993 pp. 1550–1551.

Primary Examiner—Patrick J. Ryan
Assistant Examiner—Patrick Jewik
Attorney, Agent, or Firm—Helfgott & Karas

[57] ABSTRACT

A superconducting thin film of compound oxide material deposited on a substrate, comprising a plurality of a-axis or b-axis oriented unit layers (2) and a plurality of c-axis oriented unit layers (1), each unit layer (1, 2) being made of the compound oxide material and being laminated alternately one over another on the substrate (3).

2 Claims, 1 Drawing Sheet

SUPERCONDUCTING THIN FILM OF COMPOUND OXIDE AND A PROCESS OF PREPARING THE SAME

CROSS-REFERENCE TO RELATED APPLICATIONS

This application is Rule 1.62 continuation of application Ser. No. 07/987,136, filed Dec. 8, 1992, now abandoned which is a continuation of application Ser. No. 07/722,478, filed Jun. 28, 1991 and now abandoned.

BACKGROUND OF THE INVENTION

1. Field of the Invention

The present invention relates to a superconducting thin film of compound oxide material deposited on a substrate, more particularly to a novel layered structure of a superconducting thin film of compound oxide material which exhibits substantially no anisotropy in the critical current density (Jc) against an external magnetic field. The present invention provides also a process for preparing such thin film.

In the specification, a superconducting thin film of compound oxide material means a thin film made of superconducting compound oxide possessing the critical temperature above 30K.

2. Description of the Related Art

A superconducting compound oxide material of (La, Sr)$_2$CuO$_4$ which exhibit the superconductivity at 30K was discovered in 1986 by Bednorz and Mailer (Z. Phys. B64, 1986 p 189). Another superconducting material of YBa$_2$Cu$_3$O$_7$-d having the critical temperature of about 90K was discovered, in the United States of America, in 1987 by C. W. Chu et al. (Physical Review letters, Vol. 58, No. 9, p 908). Maeda et al discovered so-called bismuth type superconducting material of Bi—Sr—Ca—Cu—O (Japanese Journal of Applied Physics. Vol. 27, No. 2, p 1209 to 1210), After then, a variety of new high-temperature compound oxide systems are discovered.

The superconducting compound oxide materials such as Y—Ba—Cu—O system, Bi—Sr—Ca—Cu—O system, Tl—Ba—Ca—Cu—O system or the like are expected to be utilized in electronics devices such as Josephson element or superconducting transistors due to their high critical temperatures (Tc). In order to realize such electronics devices, it is indispensable to prepare thin films of these oxide superconductors.

Recently, it has become possible to prepare thin films of single crystal of good quality from these superconducting compound oxide materials on a single crystal substrate of MgO, SrTiO$_3$ or the like by physical vapour deposition (PVD) technique including sputtering method, vacuum evaporation method and laser abrasion method or by chemical vapour deposition (CVD) technique.

It is known that crystals of these high-temperature compound oxide superconductors show anisotropy in their superconducting properties. In fact, their crystals show a higher value of critical current density (Jc) along the direction which is perpendicular to c-axis than the other two directions of a-axis and b-axis. Therefore, in the case of a c-axis oriented thin film of superconducting compound oxide material, electric current flows mainly in parallel with a surface of the thin film, while, in the case of an a-axis oriented or b-axis oriented thin film thereof, electric current flows mainly along a depth direction of the thin film. Still more, the superconducting compound oxide materials exhibit another anisotropy in their coherent length. Namely, the coherent length along a-axis is greater than that of along c-axis [the coherent length along c-axis is several angstroms (Å) while the coherent length along a-axis is several ten angstroms (10 Å)]. Therefore, either the a-axis (or b-axis) oriented thin film or the c-axis oriented thin film is selected according to applications.

The thin films of superconducting compound oxides exhibit also "magnetic field-induced anisotropy" in their critical current density (Jc). In other words, the critical current density (Jc) of a superconducting thin film of compound oxide material, in particular c-axis oriented thin film thereof, is influenced severely by an external magnetic field applied. In fact, when the critical current density (Jc) of a c-axis oriented superconducting thin film of compound oxide material is measured in an external magnetic field, it is confirmed that the critical current density Jc(V) which is measured in a magnetic field applied perpendicularly to a surface of the thin film is smaller than the critical current density Jc(P) which is measured in a magnetic field applied in parallel with the surface of the thin film. No theoretical explanation of the "magnetic field-induced anisotropy" can be given at this stage. In any way, such "magnetic field-induced anisotropy" is not desirable in certain applications in which stability or resistance to the external magnetic field is mostly required.

SUMMARY OF THE INVENTION

Therefore, an object of the present invention is to solve the problems of "magnetic field-induced anisotropy" and to provide a novel layered thin film structure of superconducting compound oxide material which exhibits reduced or little anisotropy in the critical current density (Jc) against the external magnetic field applied.

Another object of the present invention is to provides a process for preparing such thin film.

The present invention provides a superconducting thin film of compound oxide material deposited on a substrate, comprising a plurality of a-axis or b-axis oriented unit layers and a plurality of c-axis oriented unit layers, each unit layer being made of the compound oxide material and being laminated alternately one over another on the substrate.

The present invention provide also a process for preparing a superconducting thin film of compound oxide material on a substrate by physical vapour deposition, characterized by depositing alternately an a-axis or b-axis oriented unit layer of said compound oxide material and a c-axis oriented unit layers of said compound oxide material on a substrate on the substrate so that the superconducting thin film is composed of a plurality of the unit layers thus laminated.

DETAILED DESCRIPTION OF THE PREFERRED EMBODIMENTS

Figure 1:
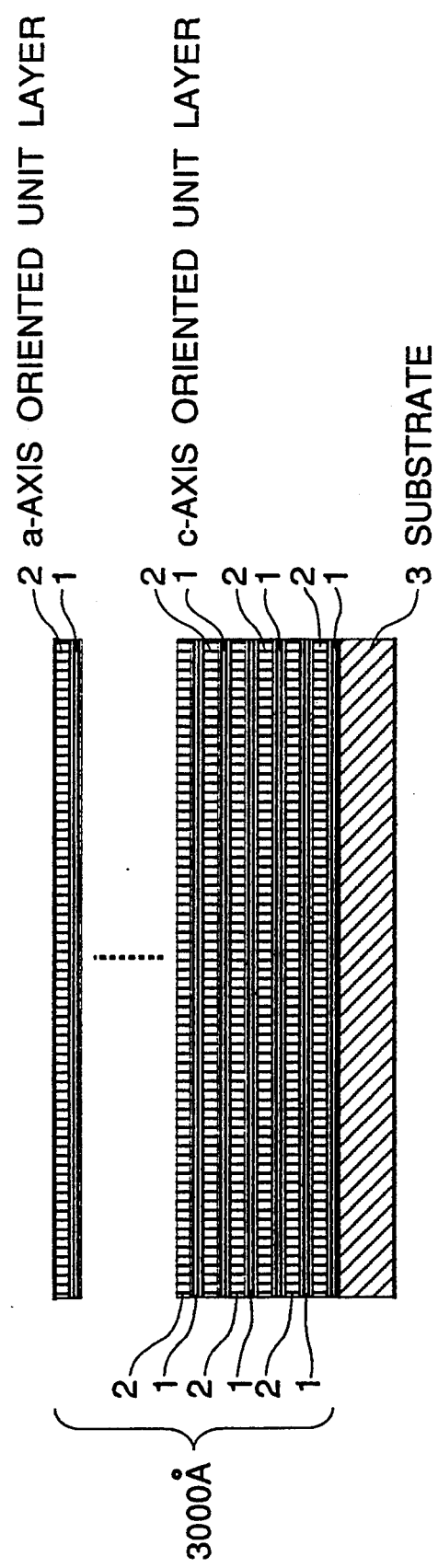
FIG. 1 is an illustrative cross sectional view of a superconducting thin film of compound oxide material deposited on a substrate according to the present invention.

As is illustrated in FIG. 1, a superconducting thin film of compound oxide material according to the present invention comprises a plurality of a-axis (or b-axis)

oriented unit layers (2) and a plurality of c-axis oriented unit layers (1), each of these unit layers (1, 2) being made of the superconducting compound oxide material and being laminated one over another alternately on a surface of a single crystal substrate (3).

The term of "a-axis oriented unit layer" means a crystalline unit thin film layer whose a-axis extends perpendicular to a surface of a substrate. Same definition is applied for "b-axis oriented unit layer" and "c-axis oriented unit layer" whose b-axis and c-axis extends perpendicular to a surface of a substrate.

In the case of superconducting thin films of compound oxide material which the present invention concern, the a-axis, b-axis and c-axis are known or definitively determined. The c-axis extends perpendicularly to a plane determined by two axes of a-axis and b-axis. Since superconducting properties along the a-axis oriented unit layer and along the b-axis oriented unit layer are substantially identical, either of them (a-axis oriented unit layer or the b-axis oriented unit layer) can be selected.

The present inventors found such a fact that the "magnetic field-induced anisotropy" of a superconducting thin film of compound oxide material can be reduced or canceled by adopting the novel layered structure according to the present invention. Namely, the anisotropy in superconducting property, in particular anisotropy in the critical current density (Jc) caused by an external magnetic field can be canceled by depositing alternately a-axis or b-axis oriented unit layers and c-axis oriented unit layers on the substrate. No theoretical explanation why the "magnetic field-induced anisotropy" is canceled can be given at this stage.

Each of the unit layers has preferably a thickness between 50 and 200 Å. If each unit layer does not have a thickness above 50 Å, adjacent two unit layers are influenced by each other and are apt to have identical crystal orientation. If the thickness of each unit layer increase above 200 Å, advantage of the present invention can not be obtained.

Total numbers of unit layers must be more than two, preferably more than four. Usually, the total thickness of a thin film of superconducting compound oxide material according to the present invention is preferably adjusted to about 3,000 Å. This thickness is determined by applications of the thin film. In a preferred embodiment of the present invention, fifteen (15) a-axis oriented unit layers and fifteen (15) c-axis oriented unit layers, each having a thickness of 100 Å, are deposited alternately on a substrate to prepare a superconducting thin film having the total thickness of 3,000 Å (100 Å×15×2=3,000 Å).

The substrate is preferably made of an oxide having a similar crystal structure or lattice constant to that of the thin film of superconducting compound oxide material to be deposited, more preferably is a single crystal substrate of MgO, SrTiO$_3$, LaAlO$_3$, LaGaO$_3$ or yttrium stabilized zirconia (YSZ).

The compound oxide material from which the thin film according to the present invention is made can be any known superconducting compound oxide including Y—Ba—Cu—O system, Bi—Sr—Ca—Cu—O system and Tl—Ba—Ca—Cu—O system. In particular, the present invention is advantageously applicable for Y—Ba—Cu—O system such as YBa$_2$Cu$_3$O$_{7-d}$ (d=±1) and Bi—Sr—Ca—Cu—O system such as Bi$_2$Sr$_2$Ca$_2$Cu$_3$O$_x$ (x=about 10).

The superconducting thin film of compound oxide material can be prepared by known physical vapour deposition technique which itself is well-known in the field of thin film forming. Among them, RF sputtering method is preferable for preparing the new layered structure according to the present invention.

All unit layers of the a-axis or b-axis oriented unit layer and the c-axis oriented unit layer can be prepared successively simply by changing the substrate temperature in a single vacuum chamber of a RF sputtering machine.

In practice, when the c-axis oriented unit layer is deposited or grown, the substrate temperature is elevated to a higher value than a value which is suitable for depositing or growing a-axis oriented unit layer. The substrate temperature depends on kinds of superconducting compound oxide used. For example, in the case of a thin film of compound oxide such as Y—Ba—Cu—O system (YBa$_2$Cu$_3$O$_{7-d}$ (d=±1)) or Bi—Sr—Ca—Cu—O system (Bi$_2$Sr$_2$Ca$_2$Cu$_3$O$_x$ (x=about 10)) is prepared, a temperature range between about 640° and about 700° C. is selected for the c-axis oriented unit layer, while a temperature range between about 600° and about 680° C. is selected for the a-axis oriented unit layer. The other operational conditions for preparing thin films of superconducting compound oxide are well-known.

Now, the present invention will be described with reference to Examples, but the scope of the present invention should not be limited thereto.

In following Examples, a thin film of superconducting compound oxide according to the present invention was prepared on a single substrate by RF magnetron sputtering.

EXAMPLE 1

A thin film of superconducting compound oxide: YBa$_2$Cu$_3$O$_{7-d}$ (d=±1) was prepared on a (100) plane of a single crystal substrate of MgO.

A target used in this Example was a sintered oxide of Y, Ba and Cu (atomic ratio: Y:Ba:Cu=1:2:2.6).

In this Example, fifteen (15) a-axis oriented unit layers and fifteen (15) c-axis oriented unit layers, each having a thickness of 100 Å, were deposited alternately on the MgO substrate to prepare a superconducting thin film having the total thickness of 3,000 Å. When the c-axis oriented unit layers were grown, the substrate is heated to a temperature of 640° C. and when the a-axis oriented unit layers were grown, the substrate was heated to a temperature of 600° C. The other operational conditions are common for the a-axis oriented unit layers and the c-axis oriented unit layers and are summarized in Table 1.

TABLE 1

| | |
|---|---|
| Gas pressure | 0.1 Torr |
| Sputtering gas | Ar + O$_2$ |
| O$_2$/(Ar + O$_2$) | 20 vol % |
| RF power density | 2 W/cm$^2$ |
| Deposition rate | 0.3 Å/sec |
| Thickness of unit layer | 100 Å |

On the resulting thin film, lead wires were bonded with silver paste to determine the critical temperature (Tc) and anisotropy in the critical current density (Jc) at 77K in an external magnetic field of 1 Tesla. The results are summarized in Table 2.

In Table 2, Jc(V) is a value of the critical current density (Jc) when the external magnetic field was applied in a direction which is perpendicular to a surface of the thin film, while Jc(P) is a value of the critical current density (Jc) when the external magnetic field was applied in a direction which is in parallel with the surface of the thin film.

For comparison, known values of Tc and Jc obtained in a c-axis oriented thin film and in an a-axis oriented thin film are also shown in Table 2.

TABLE 2

Superconducting properties of a thin film of $YBa_2Cu_3O_{7-d}$

|  | Tc (K) | Jc (A/cm$^2$) | |
|---|---|---|---|
|  |  | Jc (V) | Jc (P) |
| Invention | 88 | 5 × 10$^5$ | 4 × 10$^5$ |
| c-axis oriented film | 88 | 1 × 10$^6$ | 1 × 10$^5$ |
| a-axis oriented film | 88 | 1 × 10$^5$ | 8 × 10$^5$ |

EXAMPLE 2

The same procedure as Example 1 was repeated but the superconducting compound oxide of $YBa_2Cu_3O_{7-d}$ (d = ±1) was replaced by another superconducting compound oxide of $Bi_2Sr_2Ca_2Cu_3O_x$.

A target used in this Example was a sintered oxide of Bi, Sr, Ca and Cu (atomic ratio: Bi:Sr:Ca:Cu=2:2:2:2.6).

In this Example, when the c-axis oriented unit layers were grown, the substrate is heated to a temperature of 700° C. and when the a-axis oriented unit layers were grown, the substrate was heated to a temperature of 680° C. The other operational conditions are same as Example 1.

The results obtained are summarized in Table 3.

For comparison, known values of TC and Jc obtained in a c-axis oriented thin film and in an a-axis oriented thin film of $Bi_2Sr_2Ca_2Cu_3O_x$, are also shown in Table 3.

TABLE 3

Superconducting properties of a thin film of $Bi_2Sr_2Ca_2Cu_3O_x$.

|  | Tc (K) | Jc (A/cm$^2$) | |
|---|---|---|---|
|  |  | Jc (V) | Jc (P) |
| Invention | 95 | 3 × 10$^5$ | 2 × 10$^5$ |
| c-axis oriented film | 95 | 5 × 10$^5$ | 2 × 10$^4$ |
| a-axis oriented film | 95 | 5 × 10$^4$ | 4 × 10$^5$ |

The results reveal such a fact that the thin film according to the present invention shows no substantial "magnetic field-induced anisotropy".

We claim:

1. A superconducting thin film of compound oxide material deposited on a substrate, comprising a plurality of first layers (2) which are a-axis or b-axis oriented, and a plurality of second layers (1) which are c-axis oriented, said first and second layers being laminated on a surface of said substrate, each layer (1,2) being made of a superconducting compound oxide material, said a-axis or b-axis oriented first layers (2) and said c-axis oriented second layers (1) being alternately positioned one over another on said substrate (3) with each of said first layers juxtaposed with an adjacent one of said second layers, each layer (1,2) having a thickness between 50 Å and 200 Å so as to reduce magnetic field-induced anisotropy of the superconducting film and wherein said substrate is made of an oxide selected from the group consisting of MgO, SrTiO$_3$, LaGaO$_3$ and yttrium stabilized zirconia (YSZ) and said superconducting oxide material is Y—Ba—Cu—O system, Bi—Sr—Ca—Cu—O system or Tl—Ba—Ca—Cu—O system.

2. A superconducting thin film of compound oxide material deposited on a substrate, comprising a plurality of a-axis or b-axis oriented layers (2) and a plurality of c-axis oriented layers (1) laminated on a surface of said substrate, each layer (1,2) being made of a superconducting compound oxide material, said a-axis or b-axis oriented layers (2) and c-axis oriented layers (1) being alternately positioned one over another on said surface of said substrate (3) with each of said first layers juxtaposed with an adjacent one of said second layers, each of said layers (1,2) having a thickness between 50 Å and 200 Å so as to reduce magnetic field-induced anisotropy of the superconducting film.

* * * * *